(12) United States Patent
Bawa et al.

(10) Patent No.: US 9,488,692 B2
(45) Date of Patent: Nov. 8, 2016

(54) MODE BASED SKEW TO REDUCE SCAN INSTANTANEOUS VOLTAGE DROP AND PEAK CURRENTS

(71) Applicant: Apple Inc., Cupertino, CA (US)

(72) Inventors: Asad A. Bawa, Cedar Park, TX (US); Benjamin A. Marrou, Austin, TX (US); Christopher Ng, Austin, TX (US); Michael R. Seningen, Austin, TX (US); Mihir S. Sabnis, Austin, TX (US); Zameeruddin Mohammed, Austin, TX (US); Yi Zhao, Austin, TX (US)

(73) Assignee: Apple Inc., Cupertino, CA (US)

(*) Notice: Subject to any disclaimer, the term of this patent is extended or adjusted under 35 U.S.C. 154(b) by 163 days.

(21) Appl. No.: 14/468,394

(22) Filed: Aug. 26, 2014

(65) Prior Publication Data

US 2016/0061889 A1 Mar. 3, 2016

(51) Int. Cl.
*G01R 31/3185* (2006.01)
*G01R 31/3177* (2006.01)

(52) U.S. Cl.
CPC ... *G01R 31/318552* (2013.01); *G01R 31/3177* (2013.01); *G01R 31/318541* (2013.01); *G01R 31/318563* (2013.01); *G01R 31/318575* (2013.01)

(58) Field of Classification Search
CPC .............. G01R 31/318552; G01R 31/318541; G01R 31/3177; G01R 31/318575; G01R 31/318563
USPC ................. 714/726, 727, 729, 731, 742, 744
See application file for complete search history.

(56) References Cited

U.S. PATENT DOCUMENTS

| 5,828,870 A * | 10/1998 | Gunadisastra ............ G06F 1/10 713/401 |
| 7,383,481 B2 * | 6/2008 | Warren .......... G01R 31/318552 714/25 |
| 7,831,877 B2 * | 11/2010 | Sul ................. G01R 31/318594 714/729 |
| 7,895,488 B1 * | 2/2011 | Bertanzetti ...... G01R 31/31858 324/537 |
| 7,952,390 B2 * | 5/2011 | Takatori ......... G01R 31/318552 326/93 |
| 8,627,160 B2 * | 1/2014 | Devta-Prasanna G01R 31/318552 714/724 |

(Continued)

OTHER PUBLICATIONS

Emnett et al., Power Reduction Through RTL Clock Gating, 2000, Automotive Integrated Electronics Corporation, pp. 1-11.*

*Primary Examiner* — John J Tabone, Jr.
(74) *Attorney, Agent, or Firm* — Meyertons, Hood, Kivlin, Kowert & Goetzel, P.C.; Erik A. Heter (57) ABSTRACT

A method and apparatus for implementing mode based skew is disclosed. In one embodiment, an IC includes a number of different functional units each coupled to receive a respective one of a number of different clock signals. One or more of the functional circuit blocks includes at least two clock-gating circuits that are coupled to receive the clock signal provided to that functional circuit block. During a scan test, a first clock-gating circuit within a functional circuit block is configured to provide a first delay to the clock signal. A second clock-gating circuit within the functional circuit block may provide a second delay to the clock signal, the second delay being different from the first.

19 Claims, 7 Drawing Sheets

(56) References Cited

U.S. PATENT DOCUMENTS

| | | | | |
|---|---|---|---|---|
| 2004/0012435 | A1* | 1/2004 | Meguro | G06F 1/08 327/408 |
| 2005/0283696 | A1* | 12/2005 | Warren | G01R 31/318552 714/742 |
| 2007/0022339 | A1* | 1/2007 | Branch | G01R 31/318552 714/726 |
| 2007/0113131 | A1* | 5/2007 | Takeoka | G01R 31/318552 714/726 |
| 2007/0210833 | A1* | 9/2007 | Hamdan | G06F 1/10 326/93 |
| 2008/0103719 | A1* | 5/2008 | Seong | G01R 31/318552 702/125 |
| 2008/0115005 | A1* | 5/2008 | Kamada | G06F 1/10 713/501 |
| 2008/0282110 | A1* | 11/2008 | Guettaf | G01R 31/318552 714/30 |
| 2009/0039941 | A1* | 2/2009 | Chang | G06F 1/04 327/299 |
| 2011/0194575 | A1* | 8/2011 | Chen | G06F 1/06 372/25 |
| 2011/0260767 | A1* | 10/2011 | Devta-Prasanna | G01R 31/318552 327/285 |
| 2011/0271134 | A1* | 11/2011 | Hofmann | G06F 1/3237 713/500 |
| 2013/0254609 | A1* | 9/2013 | Yonetoku | G01R 31/318541 714/729 |
| 2013/0271197 | A1 | 10/2013 | Sanghani et al. | |
| 2013/0305078 | A1* | 11/2013 | Lee | G06F 1/08 713/500 |
| 2015/0074446 | A1* | 3/2015 | Tong | G06F 9/3851 713/502 |

* cited by examiner

MODE BASED SKEW TO REDUCE SCAN INSTANTANEOUS VOLTAGE DROP AND PEAK CURRENTS

BACKGROUND

1. Technical Field

This disclosure relates to integrated circuits (ICs), and more particularly, to the delivery of clock signals to circuits undergoing scan-based testing in an IC.

2. Description of the Related Art

Scan testing is well known in the art of IC's. Scan testing may be conducted by loading test stimulus into an IC through a scan chain. A scan chain may include a number of serially-coupled storage elements (scan elements) forming what is essentially a long shift register running through the IC. After the test stimulus data has been input into the IC, it may be applied to circuits coupled to the scan elements. The circuits within the IC may respond to the stimulus, with the outputs of such circuits being captured by scan elements. Many of the circuits to which the test stimulus is applied may switch states, with much of this switching occurring in a substantially simultaneous manner. After the circuits have been allowed enough time to switch, the data may be captured by applying a clock pulse to the inputs of the various scan elements. Subsequent to capturing the data, it may be shifted from the IC and analyzed thereafter. Analysis of the captured data may include comparing the data to expected data, which may in turn reveal whether the IC undergoing test is functioning properly.

SUMMARY

A method and apparatus for implementing mode based skew is disclosed. In one embodiment, an IC includes a number of different functional units each coupled to receive a respective one of a number of different clock signals. One or more of the functional circuit blocks includes at least two clock-gating circuits that are coupled to receive the clock signal provided to that functional circuit block. During a scan test, a first clock-gating circuit within a functional circuit block is configured to provide a first delay to the clock signal. A second clock-gating circuit within the functional circuit block may provide a second delay to the clock signal, the second delay being different from the first.

Generally speaking, a given functional circuit block may contain any number of clock-gating circuits that are coupled to receive a common clock signal. During scan testing, the given clock-gating circuits within a functional circuit block may apply different amounts of delay to the clock signals, known a skewing the clock signal. By skewing the clock signal from one clock-gating circuit to another within a functional circuit block, circuits within the circuit block may switch at different times with respect to each other. This in turn may result in a significantly smaller instantaneous voltage drop (IVD) compared to an embodiment in which all tested circuits received test stimulus data at substantially the same time. Peak currents resulting from switching during scan testing may be similarly reduced relative to those of embodiments wherein the clock signal is not skewed from one clock-gating circuit to another.

BRIEF DESCRIPTION OF THE DRAWINGS

The following detailed description makes reference to the accompanying drawings, which are now briefly described.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component.

DETAILED DESCRIPTION OF EMBODIMENTS

Figure 1:
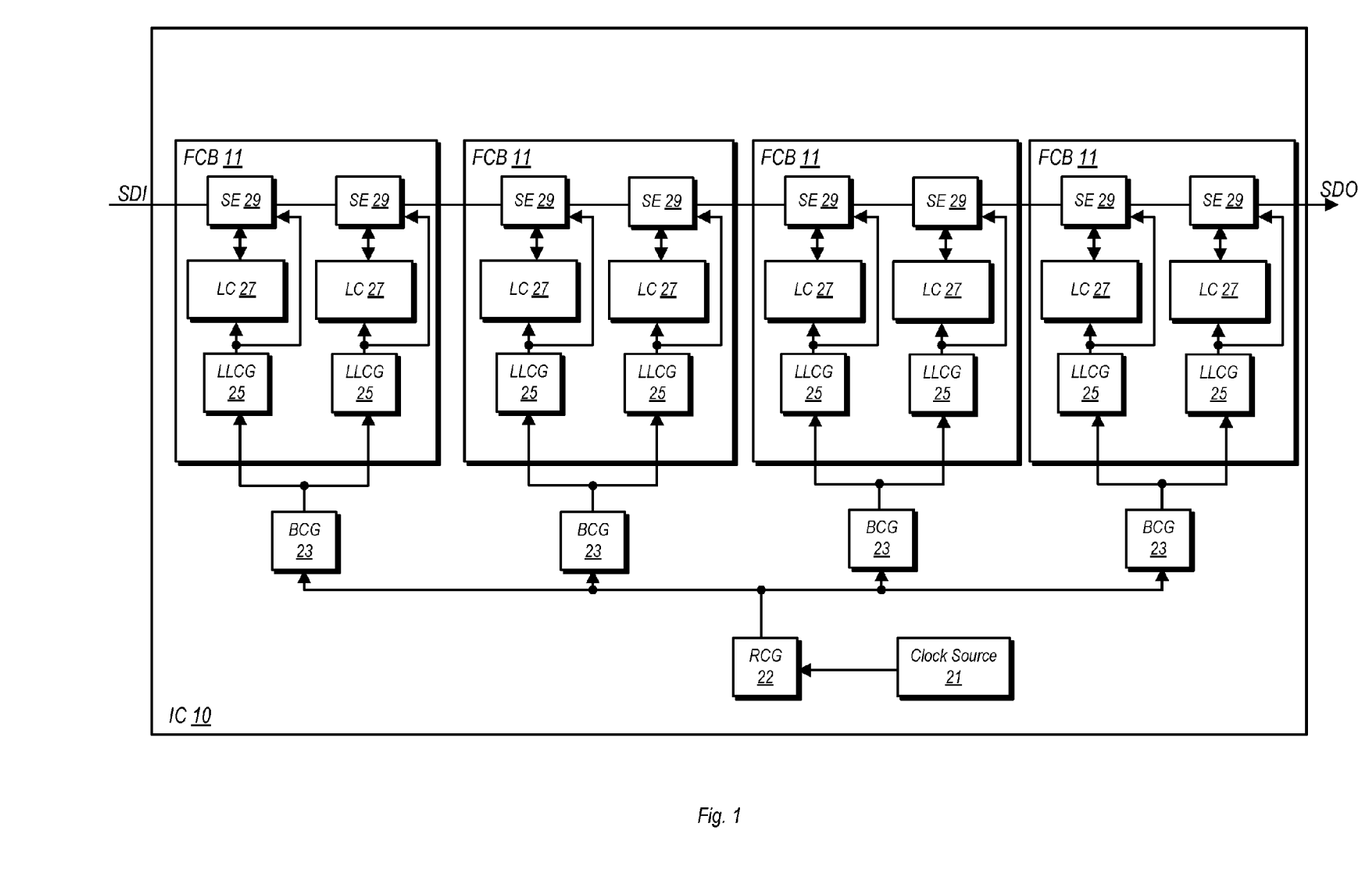
FIG. 1 is a block diagram of one embodiment of an IC having a scan chain and a clock tree.

Turning now to FIG. 1, a block diagram of one embodiment of an IC having a scan chain and a clock tree is illustrated. It is noted that the embodiment shown in FIG. 1 is for illustrative purposes, and is not intended to limit the disclosure. The various aspects of the disclosure discussed below may be implemented in a wide variety of IC embodiments.

In the embodiment shown, IC 10 includes four functional circuit blocks (FCBs) 11. Each FCB 11 includes logic circuit 27, which may include both combinational and sequential logic circuits, and may possibly include other types of circuitry (e.g., mixed signal). The logic circuits 27 in each FCB 11 may perform the various intended functions of IC 10.

Each of the logic circuits 27 in the functional circuit blocks 11 is coupled to receive a clock signal from a corresponding leaf-level clock-gating circuit (LLCG) 25. In the illustrated example, IC 10 includes a clock tree that includes a clock source 21, a root-level clock-gating circuit (RCG) 22, a number of branch-level clock-gating circuits (BCG) 23, and the LLCGs 25 in the functional circuit blocks 11. The clock signal may be distributed from the clock source, through the RCG 22, to the branch-level clock gating circuits 23, to the LLCGs 25, and finally to the logic circuits 27, as well as to scan elements 29 which are discussed below. Clock source 21 may be any suitable type of clock source, such as a phase-locked loop (PLL), oscillator, or other circuit capable of generating a periodic clock signal. In some embodiments, clock source 21 may be additionally configured to perform functions such as frequency scaling (i.e., adjusting the frequency up or down), varying the duty cycle, and so forth.

Clock-gating (i.e., the inhibiting of a clock signal from being output by a clock-gating circuit) may be performed at any of the various levels shown in the illustrated embodiment. For example, a single LLCG 25 may inhibit a clock signal from being provided to its respectively coupled logic circuits 27. In another example, a BCG 23 may inhibit a clock from being provided to its respectively coupled FCB 11.

Although not explicitly shown (for the sake of simplicity), IC 10 may include a power management circuit coupled to each of the clock-gating circuits shown in IC 10. When a given logic circuit 27 or FCB 11 has been idle for a sufficient time, the power management circuit may cause the corresponding clock-gating circuits to inhibit their respectively output clock signals. When all functional circuit blocks 11 in IC 10 are idle, the power management circuit may cause the RCG to inhibit distribution of the clock signal received from clock source 21. When a given logic circuit 27 or FCB 11 is active, the power management circuit may ensure that the corresponding clock-gating circuits allow their respectively received instances of the clock signal to be conveyed therefrom.

In the embodiment shown, IC 10 includes a plurality of scan elements 29, each of which is coupled to receive a clock signal from respectively coupled one of the LLCGs 25. In practice, each LLCG 25 may provide a clock signal to a multiple instances of a scan element 29, although providing the clock signal to as few as one scan element 29 falls within the scope of this disclosure. It is also possible in some embodiments that certain LLCGs 25 are not coupled to any scan elements.

Each scan element 29 includes at least one flop circuit (e.g., a D flip-flop) that may be used in the functional operation, but may also be used during scan test operations. The scan elements 29 shown here are serially-coupled to one another, effectively forming a large shift register. Data may be input into the scan chain from and external source through a scan data input (SDI). Data may be output from IC 10 via the scan chain through the scan data output (SDO). Data may be shifted from one scan element 29 to another through the scan chain, from a data output of one scan element 29 to a data input of the next scan element 29.

To perform a scan test, test stimulus data may be shifted into the scan chain, with each bit propagating from one scan element 29 to the next. Each of the scan elements 29 in the embodiment shown is coupled to corresponding logic circuitry 27. Each scan element 29 may apply test stimulus data to circuits (responsive to a clock signal) within its respectively coupled logic circuitry 27. The scan elements 29 may further capture test result data after allowing the circuits under test sufficient time to respond. After its capture, the test result data may be shifted from IC 10 through the scan chain, exiting through the scan data output to a tester or other device configured to receive the data.

As is discussed in further detail below, each of the LLCG 25 may be configured to, during scan test, apply a delay to the respectively received clock signal before outputting it to its correspondingly coupled logic circuitry 27 and scan element(s) 29. Within each FCB 11, the delay applied to the clock signal may be varied from one instance of LLCG 25 to the next. In this manner, the correspondingly coupled scan element(s) 29 within a given FCB 11 may apply test stimulus to their respectively coupled circuits under test at different times. As a result, the circuits under test may switch at different times, as opposed to switching substantially simultaneously if none of the clock signals were delayed (or were equally delayed). Since the switching of circuits under test may occur at different times, the instantaneous voltage drop occurring from a number of circuits switching in a substantially simultaneous manner may be less than that if all circuits switched at approximately the same time.

Figure 2:
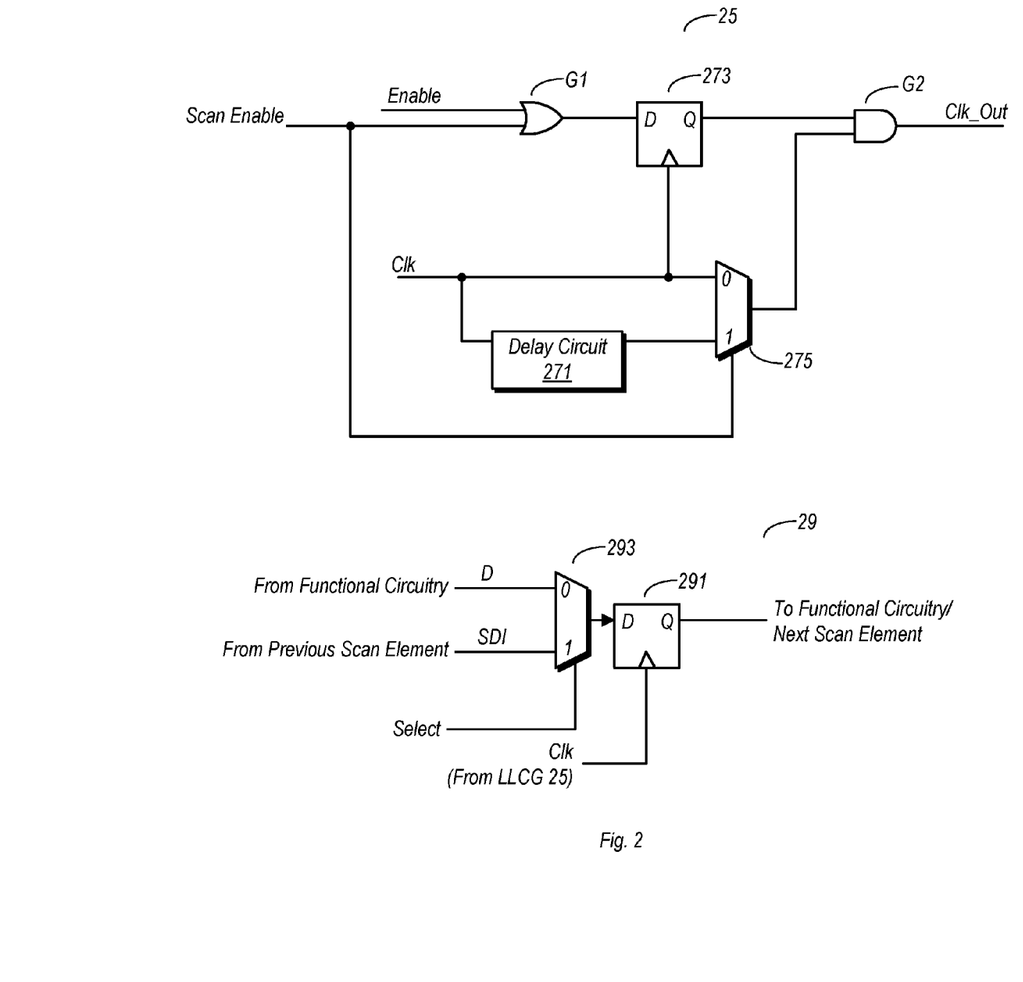
FIG. 2 is a diagram illustrating embodiments of a clock-gating circuit and scan element implemented within a functional circuit block.

FIG. 2 is a diagram illustrating embodiments of a clock-gating circuit and scan element implemented within a functional circuit block. In the embodiment shown, LLCG 25 includes a first logic gate, G1 (implemented here as an OR gate), coupled to receive an enable signal and a scan enable signal. Assertion of either one of these signals enables LLCG 25 to provide the output clock signal, Clk_Out. If neither of these signals is asserted, LLCG 25 inhibits the output clock signal from being provided. The output of G1 may be received at the D-input of latch 273, and propagated to the Q output responsive to a rising edge of the clock signal. Assertion of the Q output of latch 273 results in one of the inputs to logic gate G2 (implemented here an AND gate) to be asserted. Thus, when the Q output of latch 273 is asserted, the output of G2, Clk_Out, follows the clock signal received from selection circuit 275. When the Q output of latch 273 is not asserted, the clock signal is inhibited.

Figure 3:
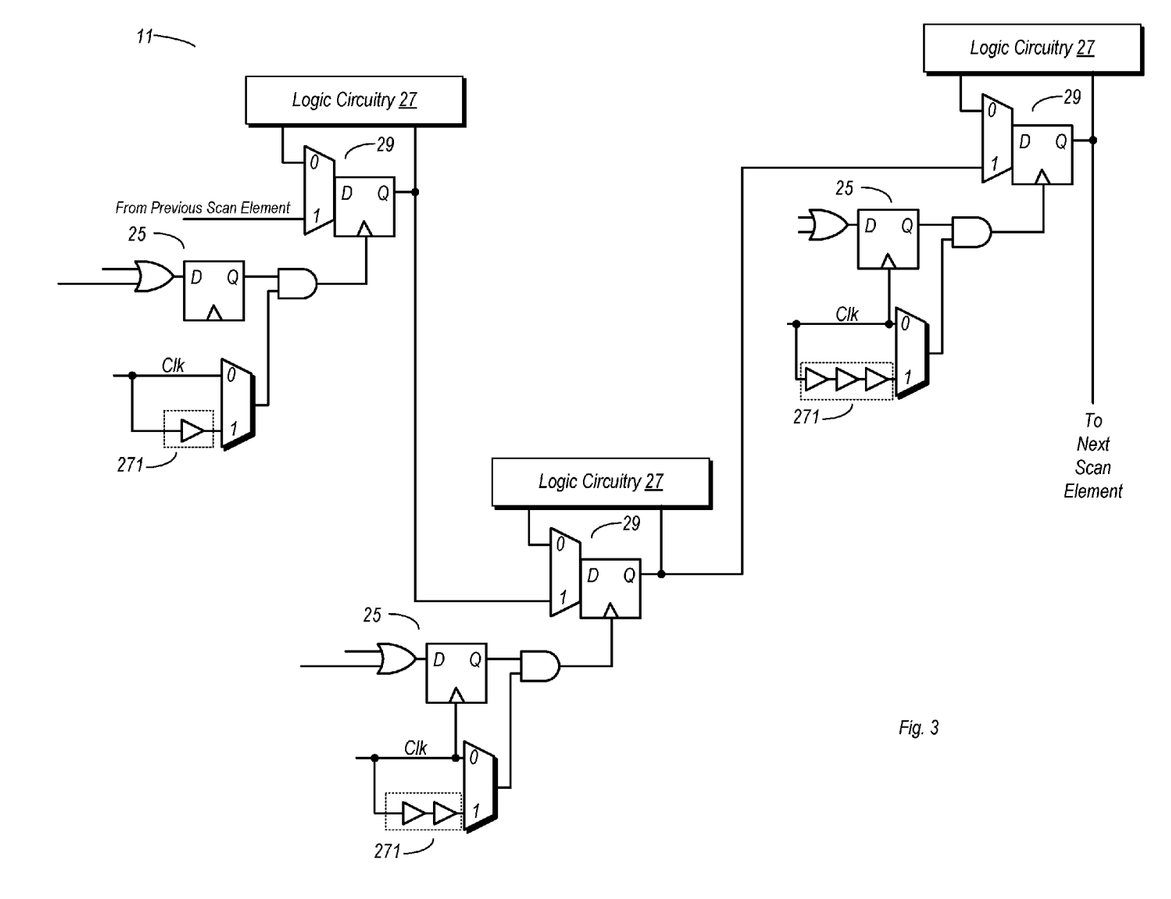
FIG. 3 is a diagram of an embodiment of a functional circuit block having clock-gating circuits configured to apply different delays during scan testing.

Selection circuit 275 in the embodiment shown includes two inputs. A first of these inputs is an undelayed version of the clock signal, Clk. The second of these inputs is a delayed version of the clock signal. The clock signal may be delayed by delay circuit 271, which may include a number of delay elements. The exact number of delay elements may vary from one instance of LLCG 25 to another, as is illustrated in FIG. 3 and discussed below.

Selection of the delayed or undelayed clock signal by selection circuit 275 is controlled by the scan enable signal in the illustrated embodiment. In particular, the scan enable signal is provided to the select input of selection circuit 275. During normal operation, the scan enable signal is de-asserted, and thus undelayed clock signal is selected and passed to the second input of G2. During scan shifting and the application of test stimulus data, the scan enable signal may be asserted, and the delayed clock signal is selected and passed to the second input of G2.

It is noted that LLCG as shown herein is but one possible embodiment of a clock-gating circuit as disclosed herein.

Other embodiments are possible and contemplated, with the common feature being a delay circuit that is able to delay the clock signal. For example, an alternate embodiment contemplates a delay circuit with a variable delay in the path of the clock signal, with the delay set differently for scan testing than for normal operation.

FIG. 2 also illustrates one embodiment of a scan element 29. In this example, scan element 29 is implemented as a multiplexer-D (or mux-D) scan element, and includes a multiplexer 293 and a D-flip-flop 291. The D input of flip-flop 291 is coupled to receive the signal selected by multiplexer 293. When the select signal to multiplexer 293 is de-asserted, the D input thereto is selected such that a signal from functional circuit is provided to the D input of flip-flop 291. When the select signal is asserted, the SDI input is selected such that a signal from a previous scan element is passed to the D input of flip-flop 291.

The output of scan element 29 may be coupled to both another instance of the same, and may also be coupled to functional circuitry. Accordingly, data may be conveyed to subsequent scan elements during scan shifting operations, and may further be applied to functional circuitry during test operations.

During scan shifting operations, the select signal may be asserted such that test stimulus data (pre-test) or test result data (post-test) may be passed from one scan element 29 to the next. Furthermore, during the application of test stimulus data, the select signal may be asserted to provide the data to the functional circuitry under test. During a capture cycle of the test, the select signal may be de-asserted to enable data output from the correspondingly coupled functional circuitry to be conveyed to flip-flop 291 via the D input of multiplexer 293. After completion of the capture cycle, the select signal may be asserted again and shift operations may commence to offload the captured test result data.

It is noted that the scan element embodiment shown here is exemplary, and is not intended to limit the disclosure. Other scan element types, such as level-sensitive scan design (LSSD) scan elements may also be implemented in various embodiments of an IC while falling within the scope of this disclosure.

FIG. 3 illustrates the arrangement of exemplary LLCGs 25 and scan elements 29 in an exemplary embodiment of a FCB 11. It is noted for the sake of simplicity and reducing clutter, not all connections are shown for the circuits illustrated in FIG. 3, although it is to be understood that these connections may be present and the same as shown in FIG. 2. It is further noted that the number of LLCGs 25 shown is also exemplary, with a greater or lesser number possible and contemplated in various embodiments.

In the illustrated example, three different instances of LLCG 25 and scan element 29 are shown. The first LLCG 25 in the sequence includes a single delay element in its respective delay unit 271, while the second LLCG 25 includes two delay elements and the third LLCG 25 includes three delay elements (these numbers are exemplary). The delay elements may be implemented using inverters, buffers, or any other suitable circuitry designed to introduce delay into a signal path.

The arrangement of the LLCGs 25 relative to their respectively coupled scan elements 29 may be chosen based on inherent clock skew. More particularly, the scan elements 29 having flip-flops with a greater clock skew may be coupled to LLCGs having a greater number of delay elements in their respective delay units 271. This arrangement may prevent hold time violations for the respectively coupled flip-flops 291, as well as for other clocked circuits not explicitly shown herein. Hold time is the minimum amount of time an input signal should be held steady subsequent to the clock edge that causes switching. Without the arrangement shown, it is possible that some clock circuits, including the flip-flops 291 shown here, may be subject to high hold time requirements, during test, which could result in the implementation of extra buffers. Accordingly, during the design phase, the ordering of scan elements 29 relative to LLCGs may be altered such that those flip-flops and other clocked circuits having the most clock skew associated therewith are coupled to the LLCGs 25 that are configured to provide greater amounts of delay to the clock signal during testing.

Figure 4:
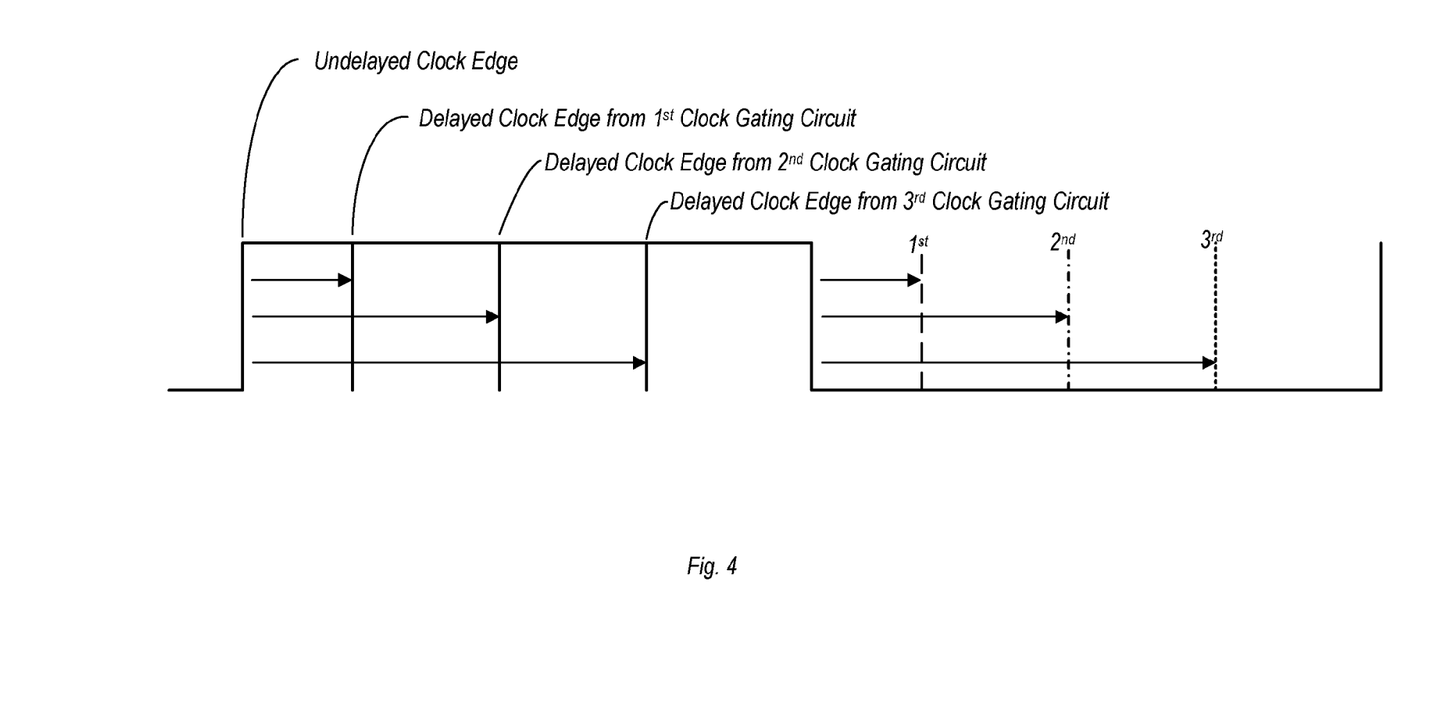
FIG. 4 is a timing diagram illustrating the skewing of clock signals within on embodiment of a functional circuit block during scan testing.

FIG. 4 is a timing diagram illustrating the skewing of clock signals within on embodiment of a functional circuit block during scan testing. The example shown here applies to an instance of an FCB 11 such as that shown in FIG. 3 in which three LLCGs 25 are implemented. In the example shown, the rising edge of the undelayed clock signal occurs first. Thereafter, rising edges occur, in sequence, from a first LLCG 25, a second LLCG 25, and a third LLCG 25, which provide successively greater amounts of delay to the clock signal. The clock circuits coupled to these LLCGs 25 may switch in accordance with their respectively received rising clock edges. Accordingly, different circuits within an FCB 11 may switch at different times during scan testing, thereby reducing IVD and peak current consumption. The falling edges of the clock signals may also be delayed as shown.

Figure 5:
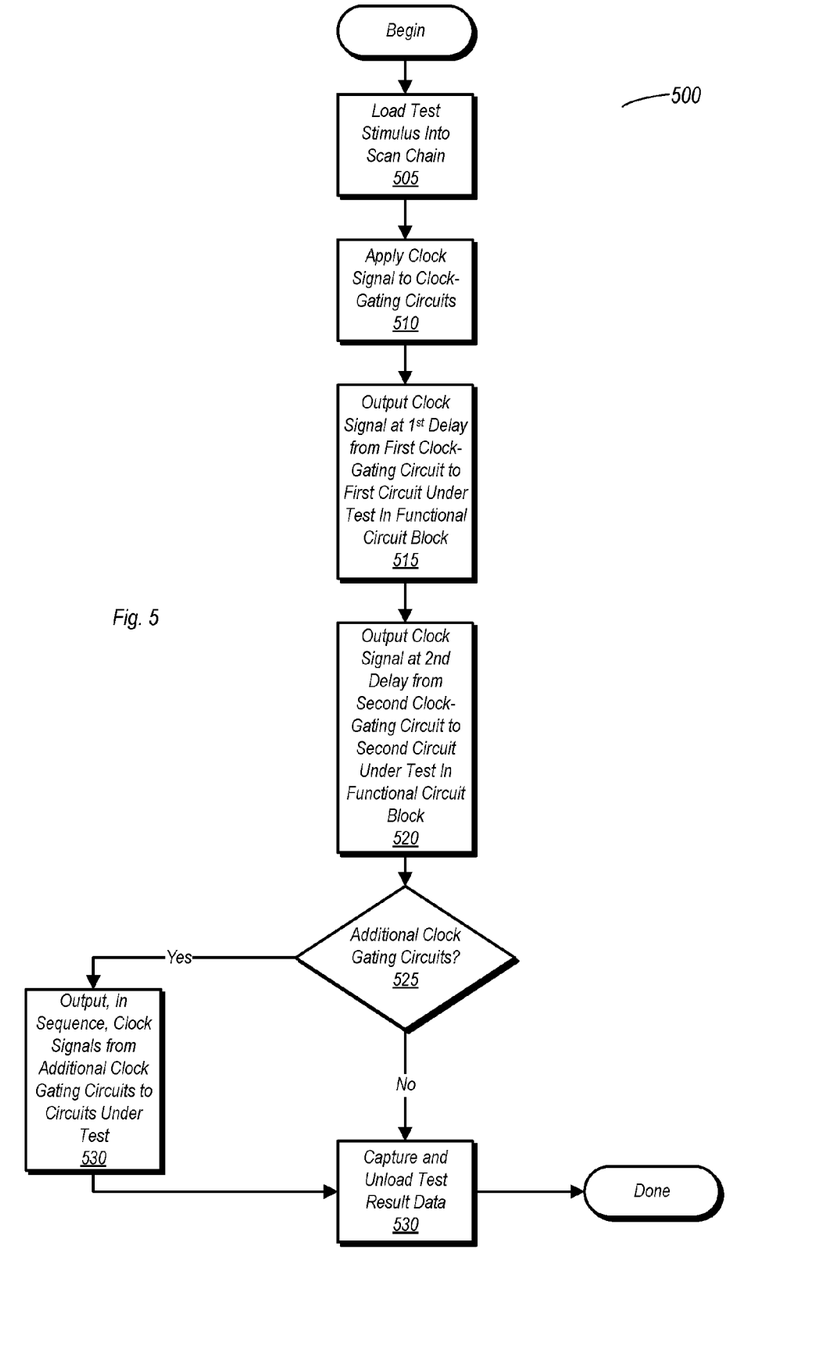
FIG. 5 is a flow diagram of one embodiment of a method for skewing clock signals within a functional circuit block during scan testing.

FIG. 5 is a flow diagram of one embodiment of a method for skewing clock signals within a functional circuit block during scan testing. Method 500 as shown herein may be performed using various embodiments of the hardware/circuitry discussed above. It is further possible and contemplated that method 500 may be performed with various hardware/circuit embodiments not disclosed herein.

Method 500 begins with the loading of test stimulus data into an IC via a scan chain (block 505). After the desired test stimulus has been loaded into teach of the scan elements of the scan chain, testing may commence by applying a clock signal to the clock gating circuits (block 510). A first clock-gating circuit within a functional circuit block may apply a first amount of delay to the received clock signal, thereby outputting a first delayed clock signal to correspondingly coupled clock circuits, including circuits under test (block 515). Subsequent thereto, a second clock-gating circuit may delay the received clock signal by a second amount of delay that is greater than the first. As a result, the second clock-gating circuit may output a second delayed clock signal (block 520). The second delayed clock signal may be output to correspondingly coupled clock circuits, including additional circuits under test.

If there are additional clock-gating circuits within the functional circuit block coupled to circuitry to be tested (block 525, yes), corresponding delayed clock signals may be output thereto (block 530). Each subsequent clock-gating circuit may output a clock signal at a delay that exceeds the previous clock-gating circuit. In other words, the delays applied to the initially received clock signal may become greater with each new instance of a delayed clock signal output from a corresponding clock-gating circuit.

As previously noted, applying the clock signals to different circuits at different times within a functional block (and thus applying test stimulus at different times) may substantially reduce IVD and peak current consumption relative to embodiments where all test stimulus is applied in substantially simultaneous manner. IVD and peak current consumption are often times localized phenomena, and thus applying different delays to the clock signals within a functional circuit block, and thus the reduction of these values may be more significant than other mechanisms designed to reduce these values on a block by block basis. Furthermore, such a reduction of IVD and peak current consumption may occur without a significant impact on test time. One previously used mechanism to reduce IVD and peak currents within an IC was to test the functional circuit blocks separately from one another, thereby adding significant test time. Various embodiments of the IC shown herein may enable concurrent testing of multiple functional circuit blocks without any negative impact of high values of IVD and/or peak current consumption.

After all test stimulus data has been applied, a capture cycle may be used to capture test result data in the various scan elements of the scan chain, which may then be unloaded from the IC by a scan shift operation (block 530).

Figure 6:
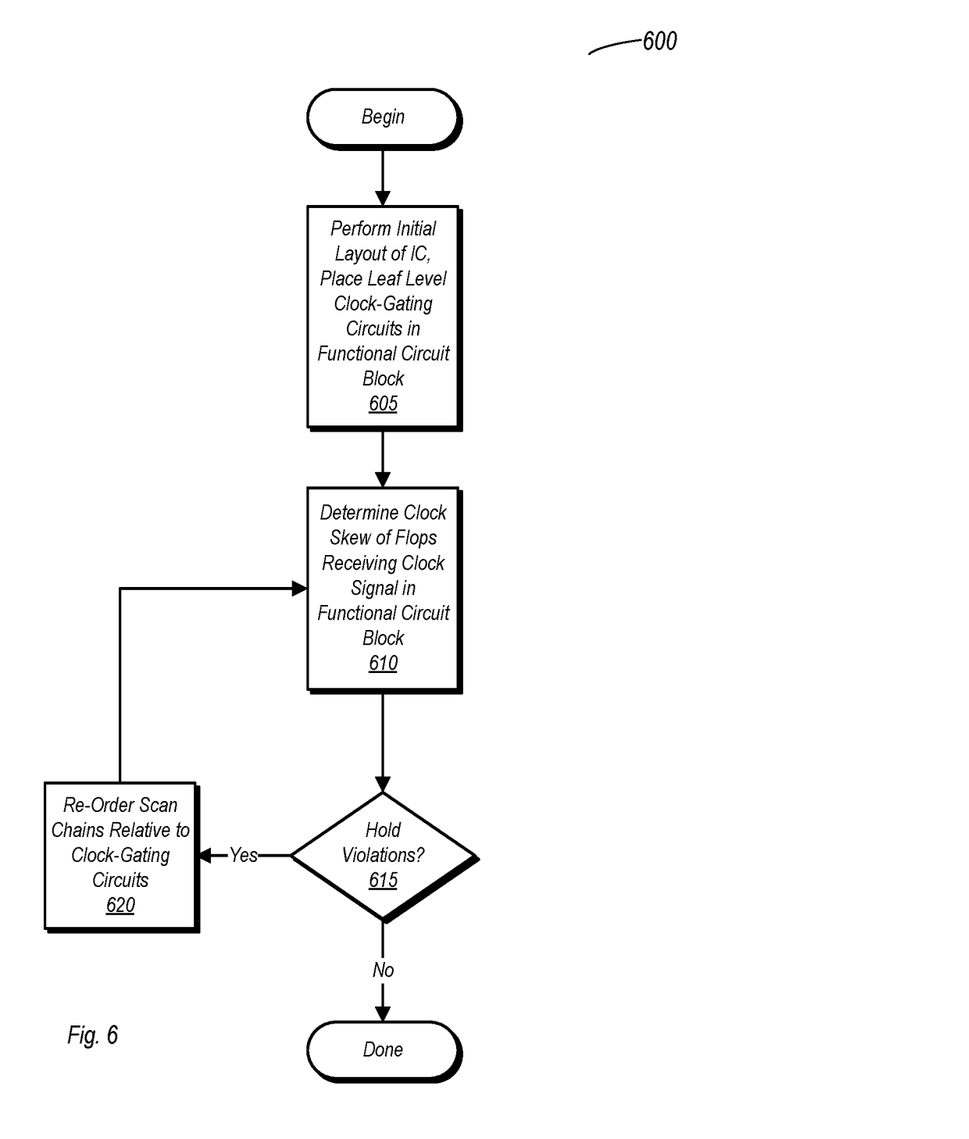
FIG. 6 is a flow diagram of one embodiment of a method for designing an IC.

FIG. 6 is a flow diagram of one embodiment of a method for designing an IC. More particularly, method 600 may be used to perform the ordering of scan elements relative to clock-gating circuits within an IC design such that hold violations do not occur during testing, if not operationally as well. The method shown here may be used to design an IC such as that discussed above, and in particular, to perform ordering within functional circuit blocks in accordance with the principles illustrated in FIG. 3.

Method 600 begins with the performing of an initial layout of an IC, during the design phase. This includes the placement of LLCGs in a functional circuit block (block 605). After the initial layout is completed, the IC design may be simulated. Analysis of the simulation results may be used to determine clock skew of the various clocked circuits within a functional circuit block (block 610). During the analysis, it may be determined if any hold time violations may be present (block 615). If no hold time violations are present (block 615, no), then the method may be complete. If hold time violations are present (block 615, yes), then elements of the scan chain may be re-ordered relative to LLCGs within the same functional circuit block (block 620). Reordering of the LLCGs respective to other clocked circuits within the functional circuit block may also be performed. Thereafter, the method may return to block 610, and may repeat the loop of block 610, 615, and 620 as many times as desired.

As an alternative, it is noted that re-ordering may sometimes occur even if there are no hold time violations. For example, LLCGs configured to provide a greater delay during testing may be coupled to scan elements and other circuits within a functional circuit block that having greater inherent clock skews even if no hold violations were detected during the simulation.

Figure 7:
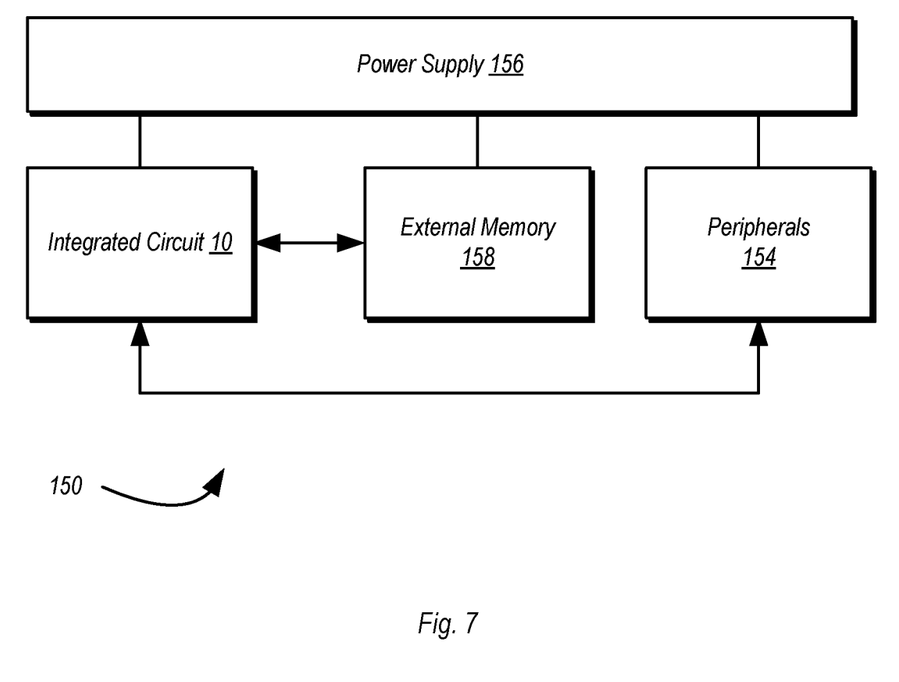
FIG. 7 is a block diagram of one embodiment of an exemplary system.

Turning next to FIG. 7, a block diagram of one embodiment of a system 150 is shown. In the illustrated embodiment, the system 150 includes at least one instance of an IC 10 coupled to one or more peripherals 154 and an external memory 158. A power supply 156 is also provided which supplies the supply voltages to the IC 100 as well as one or more supply voltages to the memory 158 and/or the peripherals 154. In some embodiments, more than one instance of the IC 100 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a plurality of functional circuit blocks each coupled to receive a respective one of one or more clock signals, wherein each of the plurality of functional circuit blocks includes logic circuitry intended to perform a function of the integrated circuit;
a first plurality of clock-gating circuits, wherein each of the plurality of functional circuit blocks includes a subset comprising two or more clock-gating circuits each coupled to receive the respective one of the clock signals for that functional circuit block, and wherein each of the first plurality of clock-gating circuits is a leaf level clock-gating circuit of a corresponding clock tree; and
a second plurality of clock-gating circuits implemented as branch level clock-gating circuits, wherein each of the second plurality of clock-gating circuits is coupled to distribute the respective one of the clock signals for that functional circuit block to the subset comprising two or more clock-gating circuits implemented in that functional circuit block;
wherein, during a scan test and within each of the plurality of functional circuit blocks, a first clock-gating circuit is configured to provide a first delay to its respectively received clock signal and a second clock-gating circuit is configured to provide a second delay different from the first to its respectively received clock signal.

2. The integrated circuit as recited in claim 1, wherein each of the first plurality of clock-gating circuits includes a multiplexer configured to select a respectively received clock signal when in an operational mode and further configured to select a delayed version of the respectively received clock signal when operating in a scan test mode.

3. The integrated circuit as recited in claim 2, wherein each of the first plurality of clock-gating circuits includes one or more delay elements configured to apply delay to the respectively received clock signal.

4. The integrated circuit as recited in claim 1, wherein an output of each of the first plurality of clock-gating circuits includes an output coupled to one or more of a plurality of scan elements.

5. The integrated circuit as recited in claim 4, wherein an output of the first clock-gating circuit is coupled to a first one of the plurality of scan elements and an output of the second clock-gating circuit is coupled to a second one of the plurality of scan elements and wherein an output of a third clock-gating circuit is coupled to a third one of the plurality of scan elements, wherein the third one of the plurality of scan elements has a greater clock skew than the second one of the plurality of scan elements, and wherein the second one of the scan elements has a greater clock skew than the first one of the plurality of scan elements.

6. The integrated circuit as recited in claim 5, wherein a data input of the third one of the plurality of scan elements is coupled to a data output of the second one of the plurality of scan elements, and wherein a data input of the second one of the plurality of scan elements is coupled to a data output of the first one of the plurality of scan elements.

7. The integrated circuit as recited in claim 1, wherein each of the one or more clock trees includes a root-level clock-gating circuit and a plurality of intermediate level clock-gating circuits, the plurality of intermediate level clock-gating circuits including the second plurality of clock-gating circuits.

8. A method comprising:
distributing a first clock signal to each of a plurality of functional circuit blocks in an integrated circuit during operation in a test mode, wherein each of the plurality of functional circuit blocks includes logic circuitry intended to perform a function of the integrated circuit, wherein distributing includes a first one of a plurality of branch level clock-gating circuits distributing the first clock signal to a correspondingly coupled one of the plurality of functional circuit blocks, wherein the first clock signal is received by at least a first clock-gating circuit and a second clock-gating circuit in a first one of the plurality of functional circuit blocks, the first and second clock-gating circuits being leaf level clock-gating circuits;
providing a first delayed clock signal from the first clock-gating circuit to one or more first scan elements in the first functional circuit block, the first delayed clock signal being delayed relative to the first clock signal by a first delay time; and
providing a second delayed clock signal to one or more second scan elements in the first functional circuit block, the second delayed clock signal being delayed relative to the first clock signal by a second delay time that is different from the first delay time.

9. The method as recited in claim 8 further comprising:
distributing the first clock signal to a second functional circuit block via a second one of the plurality of branch level clock-gating circuits, the second functional circuit block including a third clock-gating circuit and a fourth clock-gating circuit, the third and fourth clock-gating circuits being leaf level clock gating circuits;
during operation in the test mode, providing a third delayed clock signal from the third clock-gating circuit to one or more third scan elements in the second functional circuit block, the third delayed clock signal being delayed relative to the first clock signal by a first delay time; and
during operation in the test mode, providing a fourth delayed clock signal to one or more fourth scan elements in the second functional circuit block, the fourth delayed clock signal being delayed relative to the first clock signal by a fourth delay time that is different from the third delay time.

10. The method as recited in claim 8, further comprising:
providing the first clock signal to respective delayed and non-delayed inputs of the first and second clock-gating circuits;
selecting the delayed inputs of each of the first and second clock-gating circuits during operation in the test mode; and
selecting the non-delayed inputs of each of the first and second clock-gating circuits during operation in a functional mode.

11. The method as recited in claim 10, further comprising the first and second clock-gating circuits outputting non-delayed versions of the first clock signal during operation in the functional mode.

12. The method as recited in claim 8, further comprising distributing the first clock signal through a clock tree having a root level clock-gating circuit, one or more intermediate level clock-gating circuits, the intermediate level clock-gating circuits including the plurality of branch level clock-gating circuits, and a plurality of leaf level clock-gating circuits.

13. The method as recited in claim 8, wherein the first delay time is less than the second delay time, and wherein the one or more first scan elements have a clock skew that is less than a clock skew of the one or more second scan elements.

14. An integrated circuit comprising:
a plurality of functional circuit blocks each including corresponding logic circuitry intended to perform a function of the integrated circuit;
a plurality of branch level clock gating circuits, wherein each of the plurality of functional circuit blocks is coupled to receive a clock signal via a correspondingly coupled one of the plurality of functional circuit blocks;
a plurality of scannable flop circuits, wherein each of the plurality of functional circuit blocks includes one or more of the plurality of scannable flop circuits, and wherein a first functional circuit block includes a first subset of the scannable flop circuits and a second subset of the scannable flop circuits;
a first clock-gating circuit implemented in the first functional circuit block and coupled to receive a first clock signal via a first one of the plurality of branch level clock-gating circuits, wherein the first clock-gating circuit is configured to during operation in a test mode, distribute a first delayed clock signal to the first subset of scannable flop circuits, the first delayed clock signal having a first delay relative to the first clock signal; and
a second clock-gating circuit implemented in the first functional circuit block and coupled to receive the first clock signal via the first one of the plurality of branch level clock-gating circuits, wherein the first clock-gating circuit is configured to during operation in the test mode, distribute a second delayed clock signal to the second subset of scannable flop circuits, the second delayed clock signal having a second delay relative to the first clock signal that is different than the first delay.

15. The integrated circuit as recited in claim 14, wherein the second delay is greater than the first delay, and wherein each of the second subset of scannable flop circuits has a clock skew that is greater than each of the first subset of scannable flop circuits.

16. The integrated circuit as recited in claim 14, wherein each of the first and second clock-gating circuits includes a selection circuit configured to select the first and second delayed clock signals, respectively, during operation in the test mode and further configured to select first and second non-delayed versions of the clock signals, respectively, during operation in a functional mode.

17. The integrated circuit as recited in claim 14, wherein the first clock-gating circuit includes one or more delay elements configured to apply the first delay to the first clock signal in order to generate the first delayed clock signal, and wherein the second clock-gating circuit includes one or more delay elements configured to apply the second delay to the first clock signal in order to generate the second delayed clock signal.

18. The integrated circuit as recited in claim 14, wherein the integrated circuit includes a clock tree configured to distribute the first clock signal, wherein the clock tree include a root level clock-gating circuit, a plurality of intermediate level clock-gating circuits including the plurality of branch level clock-gating circuits, and a plurality of leaf level clock-gating circuits, wherein the plurality of leaf level clock-gating circuits includes the first and second clock-gating circuits.

19. The integrated circuit as recited in claim 14, further comprising a second functional circuit block including third and fourth subsets of the plurality of scannable flop circuits and further comprising third and fourth clock-gating circuits configured to provide third and fourth delayed clock signals to the scannable flop circuits of the third and fourth subsets, respectively, during operation in the test mode, wherein the third delayed clock signal has a third delay relative to the first clock signal and wherein the fourth delayed clock signal has a fourth delay relative to the first clock signal, wherein the third and fourth delays are different from one another.

* * * * *